(12) United States Patent
Minnella

(10) Patent No.: US 11,789,078 B2
(45) Date of Patent: Oct. 17, 2023

(54) ELECTRONIC DEVICE COMPRISING A MEMORY ACCESSIBLE VIA A JTAG INTERFACE, AND CORRESPONDING METHOD OF ACCESSING A MEMORY

(71) Applicant: STMicroelectronics S.r.l., Agrate Brianza (IT)

(72) Inventor: Filippo Minnella, Orbassano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/714,515

(22) Filed: Apr. 6, 2022

(65) Prior Publication Data
US 2022/0326305 A1    Oct. 13, 2022

(30) Foreign Application Priority Data
Apr. 8, 2021   (IT) .......................... 102021000008840

(51) Int. Cl.
*G01R 31/3185* (2006.01)

(52) U.S. Cl.
CPC ............. *G01R 31/318555* (2013.01); *G01R 31/318572* (2013.01)

(58) Field of Classification Search
CPC .... G01R 31/318555; G01R 31/318572; G06F 13/4022; G06F 13/385; G06F 13/4282; G06F 11/2733
See application file for complete search history.

(56) References Cited

U.S. PATENT DOCUMENTS

| 6,813,738 | B2 * | 11/2004 | Whetsel, Jr. ... | G01R 31/318555 714/724 |
| 7,587,643 | B1 | 9/2009 | Chopra | |
| 7,721,167 | B1 * | 5/2010 | Azimi .............. | G01R 31/31705 714/724 |
| 9,766,963 | B2 | 9/2017 | Datta et al. | |

(Continued)

OTHER PUBLICATIONS

Xun Jiang, Xiaoxin Cui and Dunshan Yu, "A JTAG-based configuration circuit applied in SerDes chip," 2011 9th IEEE International Conference on ASIC, Xiamen, China, 2011, pp. 707-710. (Year: 2011).*

(Continued)

*Primary Examiner* — Cynthia Britt
(74) *Attorney, Agent, or Firm* — CROWE & DUNLEVY

(57) ABSTRACT

An electronic device includes a processing unit with a memory, a JTAG interface with test-data-input and test-mode-select lines coupled to the processing unit, a bridge circuit, and a multiplexer circuit. The bridge circuit includes a serial communication interface receiving a serial data input signal which conveys an input serial data frame. The bridge circuit includes a serial-to-parallel converter circuit block receiving the input serial data frame, processing the input serial data frame to read first and second subsets of input binary values therefrom, and transmitting the first subset via a first output signal and the second subset via a second output signal. The multiplexer circuit selectively propagates a received test-data-input signal or the first output signal to the test data input line, and selectively propagates a test-mode-select signal or the second output signal to the test mode select line of the JTAG interface.

12 Claims, 2 Drawing Sheets

(56) References Cited

U.S. PATENT DOCUMENTS

| | | |
|---|---|---|
| 10,824,530 B2 | 11/2020 | Kuehnis et al. |
| 2021/0270894 A1* | 9/2021 | Spica ................. G01R 31/3177 |
| 2021/0389371 A1* | 12/2021 | Liew ................ G01R 31/31705 |

OTHER PUBLICATIONS

IT Search Report and Written Opinion for priority application, IT Appl. No. 102021000008840, report dated Nov. 19, 2021, 7 pgs.

* cited by examiner

ELECTRONIC DEVICE COMPRISING A MEMORY ACCESSIBLE VIA A JTAG INTERFACE, AND CORRESPONDING METHOD OF ACCESSING A MEMORY

PRIORITY CLAIM

This application claims the priority benefit of Italian Application for Patent No. 102021000008840, filed on Apr. 8, 2021, the content of which is hereby incorporated by reference in its entirety to the maximum extent allowable by law.

TECHNICAL FIELD

The description relates to electronic devices including testability features, e.g., devices designed according to known "design for testability" (DFT) techniques. One or more embodiments may be applied to devices provided with a Joint Test Action Group (JTAG) interface.

BACKGROUND

JTAG, named after the Joint Test Action Group, is an industry standard implemented for device testing purposes. The JTAG standard specifies the use of a dedicated debug port (a JTAG port) implementing a communications interface for low-overhead access to devices without the use of direct external access to the system address and data buses. A JTAG interface connects to an on-chip Test Access Port (TAP).

The JTAG standard is based on a multi-wire communication protocol: a conventional JTAG interface comprises four lines named TDI (Test Data In), TDO (Test Data Out), TCK (Test Clock), and TMS (Test Mode Select).

A JTAG interface can also be used to transfer (e.g., write) data into an internal non-volatile memory of an electronic device (e.g., to store firmware code portions of the device). However, once a device is packaged in a more complex electronic system, the pins of the JTAG port may not be accessible anymore, and programming of the non-volatile memory of the electronic device cannot be performed via the JTAG interface anymore.

According to a first approach, the non-volatile memory of the device may be accessed by bypassing the JTAG controller. However, such an approach heavily complicates the access to the resources controlled by the JTAG controller (e.g., relying on bus multiplexing).

According to another approach, the non-volatile memory of the device may be accessed by resorting to the SWD (Serial Wire Debug) protocol developed by ARM. Such an approach relies on a proprietary IP by ARM and thus requires the usage of specific hardware to support the corresponding communication protocol. Additionally, the SWD protocol utilizes two accessible pins, which is unsatisfactory insofar as electronic devices are getting smaller and smaller and low pin count devices (e.g., microcontrollers) are available.

Therefore, there is a need in the art to provide electronic devices which permit convenient access of the JTAG interface.

SUMMARY

One or more embodiments contribute to providing improved electronic devices which facilitate accessing the internal JTAG interface.

One or more embodiments may relate to an electronic device.

One or more embodiments may relate to a corresponding method of accessing a memory of an electronic device.

In one or more embodiments, an electronic device may include a processing unit including a memory, a JTAG interface having a test data input line and a test mode select line and coupled to the processing unit, a bridge circuit, and a multiplexer circuit. The bridge circuit may have a serial communication interface configured to receive a serial data input signal which conveys at least one input serial data frame including a set of input binary values. The bridge circuit may have a serial-to-parallel converter circuit block configured to receive the at least one input serial data frame, process the at least one input serial data frame to read a first subset of input binary values and a second subset of input binary values from the set of input binary values, and transmit the first subset of input binary values via a first output signal and transmit the second subset of input binary values via a second output signal. The multiplexer circuit may be configured to selectively propagate to the test data input line of the JTAG interface either a test data input signal received at a respective pin of the electronic device or the first output signal transmitted by the bridge circuit, and selectively propagate to the test mode select line of the JTAG interface either a test mode select signal received at a respective pin of the electronic device or the second output signal transmitted by the bridge circuit.

One or more embodiments may thus facilitate accessing a JTAG interface of an electronic device, also when the device is packaged in a more complex electronic system.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for brevity.

Figure 1:
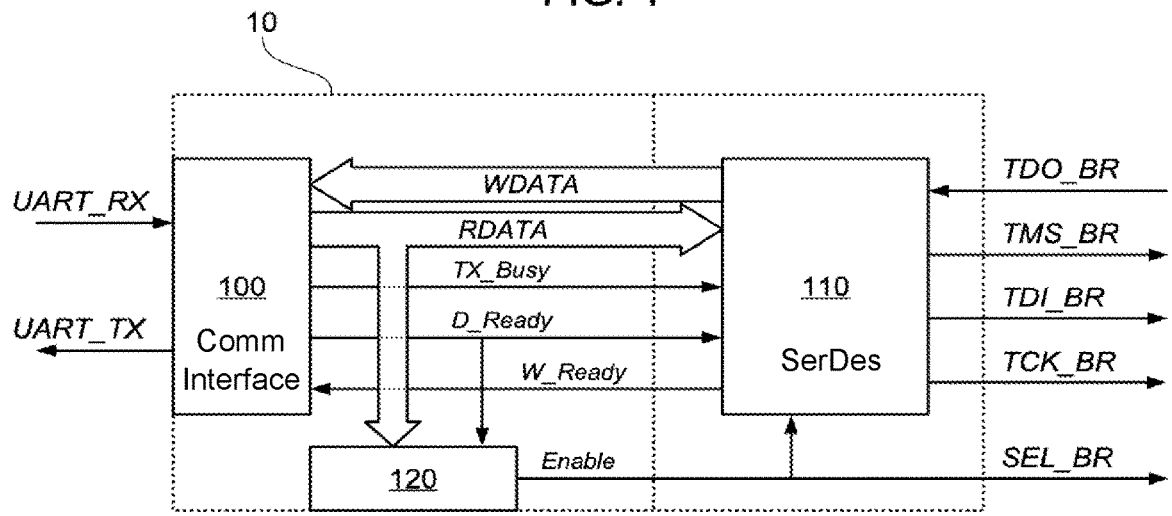
FIG. 1 is a circuit block diagram exemplary of a bridge circuit according to one or more embodiments of the present description.

For the purpose of conveniently accessing the JTAG interface of an electronic device, one or more embodiments of the instant description relate to a bridge circuit 10 as exemplified in FIG. 1 (e.g., a "UART-to-JTAG" bridge circuit).

A universal asynchronous receiver-transmitter (UART) is a hardware device for asynchronous serial communication. A UART interface may send data bits one by one, from the least significant bit to the most significant bit, framed by start and stop bits.

As exemplified in FIG. 1, a bridge circuit 10 may comprise a conventional serial communication interface 100 (e.g., a UART interface) operating in full-duplex mode, e.g., configured to receive an input signal UART_RX via a single input pin (single wire) and to transmit an output signal UART_TX via a single output pin (single wire). Alternatively, the serial communication interface 100 may operate in half-duplex mode, e.g., it may be configured to receive the input signal UART_RX and to transmit the output signal UART_TX via a single input/output pin (single wire).

The bridge circuit 10 may also comprise a serializer/deserializer circuit 110 (SerDes circuit hereinafter) coupled to the serial communication interface 100. For instance, the SerDes circuit 110 may receive data RDATA from the serial communication interface 100 via a read data channel and may provide data WDATA to the serial communication interface 100 via a write data channel. The SerDes circuit 110 may be configured to provide signals TMS_BR, TDI_BR and TCK_BR to the corresponding TMS, TDI and TCK lines of a JTAG interface (not visible in FIG. 1), and optionally receive a signal TDO_BR from a corresponding TDO line of the JTAG interface.

Additionally, the SerDes circuit 110 may receive from the serial communication interface 100 a signal D_Ready indicative of the fact that data was received at the input pin and is available for processing by the SerDes circuit 110. Additionally, the SerDes circuit 110 may provide to the serial communication interface 100 a signal W_Ready indicative of the fact that data was received by a JTAG interface, processed by the SerDes circuit 110 and is ready to be transmitted to the interface 100. The SerDes circuit 110 may also receive from the serial communication interface 100 a signal TX_Busy indicative of the fact that the interface 100 is busy and cannot transmit via the respective output pin.

The bridge circuit 10 may comprise an enabling logic circuit 120 which receives the data RDATA and the signal D_Ready from the serial communication interface 100, and asserts a signal Enable for enabling the SerDes circuit 110. Thus, the logic circuit 120 may implement an algorithm that enables the bridge circuit 10 and allows substituting the conventional JTAG lines. For instance, the bridge circuit 10 may be enabled in response to an expected sequence (e.g., an enablement sequence) of frames (e.g., UART frames) being received via the input signal UART_RX at the serial communication interface 100. The enable signal Enable is received at the SerDes circuit 110, and is also transmitted outside of the bridge circuit 10 towards the JTAG interface as a selection signal SEL_BR.

As exemplified in FIG. 1, the SerDes circuit 110 may thus be configured to process the data RDATA received from a serial communication interface 100 (e.g., a UART interface) to produce respective signals TMS_BR and/or TDI_BR suitable to be received by a JTAG interface at the corresponding TMS and/or TDI lines (deserialization processing).

Additionally, the SerDes circuit 110 may be configured to produce a clock signal TCK_BR suitable to be received by a JTAG interface at the corresponding TCK line. For instance, the clock signal TCK_BR may be generated locally starting from on-chip clock signal.

Additionally, the SerDes circuit 110 may be configured to process the signal TDO_BR received from a corresponding TDO line of a JTAG interface to produce data WDATA suitable to be transmitted outside of the device via a serial communication interface 100 (e.g., a UART interface) (serialization processing).

Figure 2:
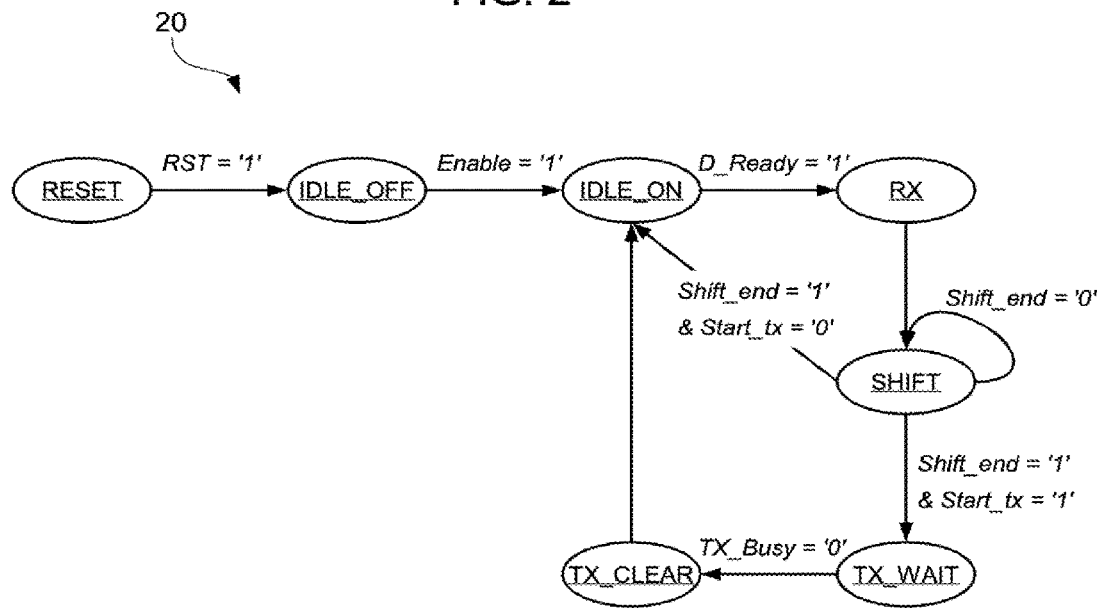
FIG. 2 is a block diagram exemplary of operation of a finite state machine according to one or more embodiments of the present description.

FIG. 2 is a block diagram exemplary of operation of a finite state machine (FSM) 20 possibly implemented by the SerDes circuit 110.

As exemplified in FIG. 2, operation of the SerDes circuit 110 starts from a RESET state, during which the SerDes circuit 110 is waiting for a system reset.

In response to a reset signal RST being asserted (e.g., set to '1'), the SerDes circuit 110 switches to an IDLE_OFF state, during which the SerDes circuit 110 is waiting for a procedure that enables the bridge circuit.

In response to the enable signal Enable being asserted (e.g., set to '1') by the logic circuit 120, the SerDes circuit 110 switches to an IDLE_ON state, during which the SerDes circuit 110 is ready to process input data RDATA received from the serial communication interface 100, e.g., the SerDes circuit 110 is waiting for the signal D_Ready being asserted (e.g., set to '1') by the interface 100.

In response to the D_Ready signal being asserted by the serial communication interface 100, the SerDes circuit 110 switches to an RX state, during which the SerDes circuit 110 is sampling the data RDATA received from the interface 100 and is initializing a shift procedure. The RX state is used to sample the data coming from the interface 100, and it is followed by a SHIFT state.

After the RX state, the SerDes circuit 110 switches to a SHIFT state, during which the SerDes circuit 110 generates a clock signal TCK_BR and shifts out the de-serialized content of RDATA through the signals TDI_BR and/or TMS_BR. In the SHIFT state, the SerDes circuit 110 may additionally save (e.g., store into a register) serialized values of the input signal TDO_BR as data WDATA to be transmitted to the serial communication interface 100.

In the SHIFT state, the finite state machine produces an internal control signal Shift_end that is set to '0' as long as the number of executed shift operations is lower than a selected dimension of a data subset (e.g., lower than 4). The control signal Shift_end is set to '1' when the number of executed shift operations is equal to or higher than the selected dimension of a data subset, which indicates that the whole received data has been shifted out. As long as a control signal Shift_end is de-asserted (e.g., set to '0'), the SerDes circuit 110 stays in the SHIFT state.

It is noted that the bridge circuit 10 may be adapted to protocols different from the UART protocol, which may have a different data byte length, by adapting the generation logic of the control signal Shift_end (e.g., selecting a different threshold which triggers the commutation of the control signal Shift_end).

In the SHIFT state, the finite state machine may produce another internal control signal Start_tx that is set to '1' in response to the number of bits received via the TDO_BR signal and shifted out being equal to a certain threshold (e.g., equal to the UART data byte length).

It is noted that states RX and SHIFT may be somewhat redundant, insofar as the RX state is followed by the SHIFT state without having to satisfy a specific condition. Additional states do not generate problems in communication latency, insofar as the clock signal that feeds the finite state machine 20 may be much faster than the baud-rate of the serial communication interface (e.g., the UART baud-rate), thereby allowing relaxation of time constraints and the adding of states in the state machine in order to improve data synchronization between interfaces.

In response to the control signal Shift_end being asserted (e.g., set to '1'), the SerDes circuit 110 may switch either to state IDLE_ON if the control signal Start_tx is not asserted (e.g., set to '0'), or to a state TX_WAIT if the control signal Start_tx is asserted (e.g., set to '1').

In the state TX_WAIT, the SerDes circuit 110 may assert the signal W_Ready (e.g., set W_Ready to '1') to signal that the data received from the JTAG interface via the signal TDO_BR is available as WDATA on the write data channel and is ready to be sent outside of the device through the serial communication interface 100 via signal UART_TX. In the state TX_WAIT, the SerDes circuit 110 may de-assert the control signal Start_tx '0', insofar as it may be sufficient a trigger to the interface 100 to start the transmission. In the state TX_WAIT, the SerDes circuit 110 may also wait for signal TX_Busy to be de-asserted (e.g., set to '0'), thereby the interface 100 signaling an end of a transmission.

In response to the TX_Busy signal being de-asserted (e.g., set to '0') by the serial communication interface 100, the SerDes circuit 110 may switch to a TX_CLEAR state, during which the interface 100 and the JTAG interface are de-initialized.

After state TX_CLEAR, the SerDes circuit 110 may switch from state TX_CLEAR to state IDLE_ON.

Figure 3:
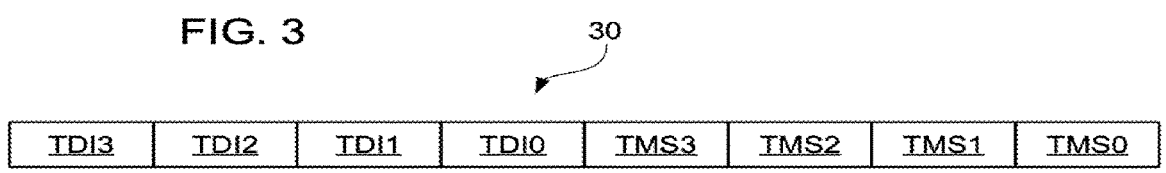
FIG. 3 is exemplary of an input frame received in a bridge circuit according to one or more embodiments of the present description.

As exemplified in FIG. 3, in one or more embodiments, an 8-bit UART frame RDATA 30 received at the interface 100 via input signal UART_RX may comprise a first set of four bits (e.g., the four most significant bits of the UART frame) carrying four data bits TDI3, TDI2, TDI1 and TDI0 to be propagated to the TDI line of a JTAG interface via signal TDI_BR, and a second set of four bits (e.g., the four least significant bits of the UART frame) carrying four data bits TMS3, TMS2, TMS1 and TMS0 to be propagated to the TMS line of the JTAG interface via signal TMS_BR. Therefore, the received data RDATA contains the TDI_BR and TMS_BR values at each clock cycle; each packet (e.g., each UART frame) contains 4 clock cycle values. These data bits can be used by a programmer device to program the memories accessible via the JTAG interface, even when the JTAG interface itself is not accessible.

Therefore, the SerDes circuit 110 may be configured to deserialize the received frames RDATA by transmitting a first subset of bits of each frame RDATA via signal TDI_BR, and a second subset of bits of each frame RDATA via signal TMS_BR.

In one or more embodiments, the data bits of the first subset (e.g., bits TDI) and the second subset (e.g., bits TMS) may be arranged in the frames received at the serial communication interface 100 via signal UART_RX in any configuration. Purely by way of example, the data bits of the first subset and the second subset may be alternated or interleaved in a single received frame, e.g., in the following order: TDI0, TMS0, TDI1, TMS1, TDI2, TMS2, TDI3, TMS3. Other arrangements are possible (e.g., interleaving pairs of bits in the following order: TDI0, TDI1, TMS0, TMS1, TDI2, TDI3, TMS2, TMS3). Additionally or alternatively, each received frame may include more than two subsets of data bits (e.g., in the case of parallel output communication using more than two data lines).

Figure 4:
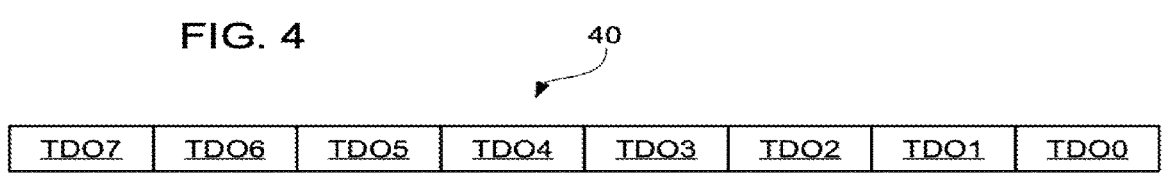
FIG. 4 is exemplary of an output frame transmitted by a bridge circuit according to one or more embodiments of the present description.

As exemplified in FIG. 4, in one or more embodiments, an 8-bit UART frame WDATA 40 provided to the interface 100 by the SerDes circuit 110 may comprise a set of eight bits carrying eight data bits TDO7 to TDO0 received from the TDO line of a JTAG interface via signal TDO_BR, which can be propagated outside of the device via the output signal UART_TX. Therefore, the device may return TDO_BR output values, saving them in an 8-bit register and returning them to an external programmer device using the serial communication interface 100. For instance, the device may return one 8-bit data frame WDATA every two received data frames RDATA.

Figure 5:
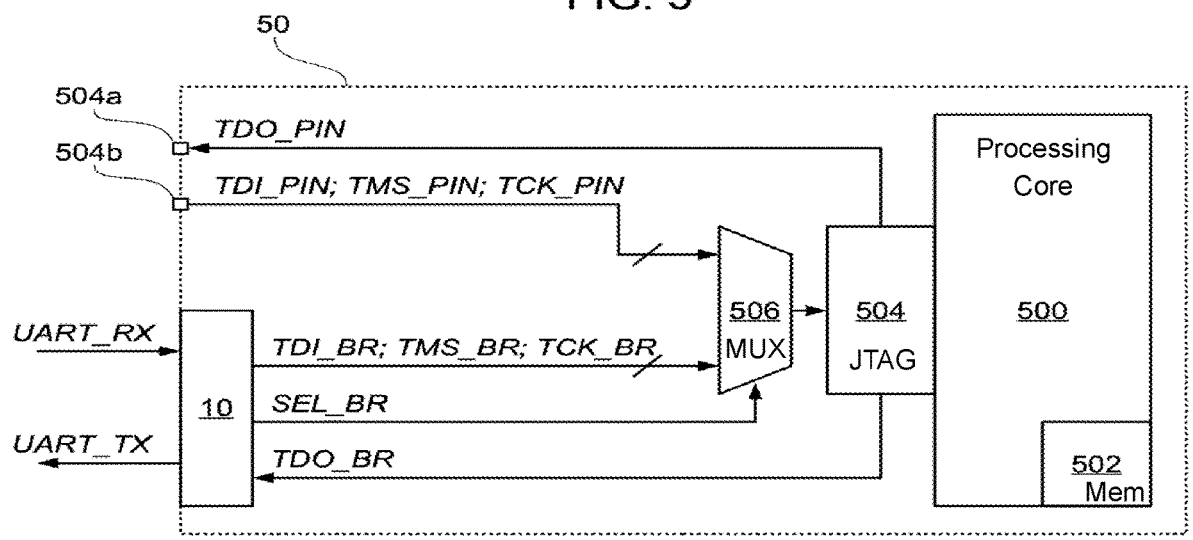
FIG. 5 is a circuit block diagram exemplary of an electronic device including a bridge circuit according to one or more embodiments of the present description.

FIG. 5 is a circuit block diagram exemplary of an electronic device 50 (e.g., a microcontroller unit or an ASIC). As exemplified in FIG. 5, the device 50 may comprise a processing core 500 and at least one memory 502 (e.g., a non-volatile memory) coupled to the processing core 500. The device 50 may also comprise a JTAG interface 504 coupled to the processing core 500, and a set of I/O pins 504a, 504b (e.g., a JTAG port) coupled to the JTAG interface 504 for receiving and providing the JTAG signals.

In particular, the device 50 may comprise an output pin 504a coupled to the TDO line of the JTAG interface 504 to provide a signal TDO_PIN outside of the device 50. The device 50 may comprise a set of input pins 504b coupled, respectively, to the TDI line, the TMS line, and the TCK line of the JTAG interface 504 via a multiplexer circuit 506 to receive respective signals TDI_PIN, TMS_PIN, and TCK_PIN for operation of the JTAG interface 504.

The electronic device 50 may also comprise a bridge circuit 10 (e.g., a UART-to-JTAG bridge circuit) as disclosed, for instance, with reference to FIG. 1, which provides alternative JTAG signals TDI_BR and TMS_BR resulting from the deserialization of the input signal UART_RX received at the serial communication interface 100 of the bridge circuit 10, as well as an alternative JTAG clock signal TCK_BR. The bridge circuit 10 may also receive the JTAG output signal TDO_BR from the JTAG interface 504 (the signal TDO_BR being substantially a replica of the conventional JTAG output signal TDO_PIN). The alternative JTAG signals TDI_BR, TMS_BR, and TCK_BR are received at the multiplexer circuit 506, which is controlled by the control signal SEL_BR provided by the bridge circuit 10.

Therefore, in one or more embodiments, a device 50 may comprise a JTAG interface 504 which can operate in two alternative modes. A first, "conventional" mode (e.g., settable with SEL_BR='0') can be used when the JTAG pins 504a, 504b of the device 50 are accessible, so that the JTAG interface 504 receives signals TDI_PIN, TMS_PIN, and TCK_PIN from pin 504b and provides signal TDO_PIN to pin 504a. A second, "programming" mode (e.g., settable with SEL_BR='1') can be used when the JTAG pins 504a, 504*b* of the device 50 are not accessible, so that the JTAG interface 504 receives signals TDI_BR, TMS_BR, and TCK_BR resulting from the deserialization of an input signal UART_RX received at the bridge circuit 10, and optionally provides signal TDO_BR to the bridge circuit 10 to serialize its content and transmit it outside of the device 50 via the output signal UART_TX transmitted by the bridge circuit 10.

Therefore, in one or more embodiments a bridge circuit 10 may be used to handle programming access of a core system (e.g., a non-volatile memory thereof), also when the device is mounted in a more complex system which can be accessed using two data lines (e.g., if the serial communication interface 100 of the bridge circuit 10 operates in full-duplex mode) or one data line (e.g., if the serial communication interface 100 of the bridge circuit 10 operates in half-duplex mode).

One or more embodiments may thus provide one or more of the following advantages: possibility of accessing the core of a device using a slow and simple single-wire protocol (e.g., UART); controller steps of the Test Access Port (TAP) can be coded externally by the programmer, so that the device simply receives the serial (e.g., UART) packets (or frames) and de-serializes them using a small logic; limited silicon area occupation (e.g., the bridge circuit 10 may occupy an area of approximately 0.02 mm$^2$ in BCD9SL manufacturing technology); and reduced cost.

As exemplified herein, an electronic device (e.g., 50) may include: a processing unit (e.g., 500) including at least one memory (e.g., 502); a JTAG interface (e.g., 504) coupled to the processing unit (500), the JTAG interface comprising a test data input line and a test mode select line, wherein the at least one memory is accessible via the JTAG interface; a bridge circuit (e.g., 10); and a multiplexer circuit (e.g., 506).

As exemplified herein, the bridge circuit may include: a serial communication interface (e.g., 100) configured to receive a serial data input signal (e.g., UART_RX), the serial data input signal conveying at least one input serial data frame (e.g., 30) comprising a set of input binary values; and a serial-to-parallel converter circuit block (e.g., 110).

As exemplified herein, the serial-to-parallel converter circuit block may be configured to: receive the at least one input serial data frame from the serial communication interface, process the at least one input serial data frame to read a first subset of input binary values (e.g., TDI3, TDI2, TDI1, TDI0) and a second subset of input binary values (e.g., TMS3, TMS2, TMS1, TMS0) from the set of input binary values; transmit the first subset of input binary values via a first output signal (e.g., TDI_BR); and transmit the second subset of input binary values via a second output signal (e.g., TMS_BR).

As exemplified herein, the multiplexer circuit may be configured to selectively (e.g., SEL_BR) propagate to the test data input line of the JTAG interface either a test data input signal (e.g., TDI_PIN) received at a respective pin (e.g., 504*b*) of the electronic device or the first output signal transmitted by the bridge circuit, and to selectively propagate to the test mode select line of the JTAG interface either a test mode select signal (e.g., TMS_PIN) received at a respective pin of the electronic device or the second output signal transmitted by the bridge circuit.

As exemplified herein, the set of input binary values may comprise an even number of binary values, the first subset of input binary values may comprise a first half of binary values in the set of input binary values, and the second subset of input binary values may comprise a second half of binary values in the set of input binary values different from the first half.

As exemplified herein, the set of input binary values may comprise eight binary values, the first subset of input binary values may comprise four adjacent binary values in the set of input binary values, and the second subset of input binary values may comprise another four adjacent binary values in the set of input binary values.

As exemplified herein, the bridge circuit may comprise a parallel-to-serial converter circuit block (e.g., 110) configured to: receive a test data output signal (e.g., TDO_BR) from the JTAG interface; process the received test data output signal to read a sequence of binary values (e.g., TDO7, . . . , TDO0) conveyed by the received test data output signal and arrange the sequence of binary values in at least one output serial data frame (e.g., 40); and transmit the at least one output serial data frame to the serial communication interface, which may be configured to transmit a serial data output signal (e.g., UART_TX) conveying the at least one output serial data frame.

As exemplified herein, the serial communication interface may be configured to operate in half-duplex mode to receive the serial data input signal and transmit the serial data output signal via a single data line.

As exemplified herein, the serial communication interface may be configured to operate in full-duplex mode to receive the serial data input signal via a respective input data line and transmit the serial data output signal via a respective output data line.

As exemplified herein, the bridge circuit may comprise a logic circuit (e.g., 120) configured to assert an enable signal (e.g., Enable) in response to the serial data input signal conveying an expected enablement sequence of input serial data frames, the serial communication interface may be configured to assert a control signal (e.g., D_Ready) in response to at least one input serial data frame being received, and the serial-to-parallel converter circuit block may be configured to start processing the at least one input serial data frame in response to the enable signal and the control signal being asserted.

As exemplified herein, the serial communication interface may comprise a UART interface.

As exemplified herein, a method of accessing a memory of an electronic device according to one or more embodiments may include: receiving at the serial communication interface a serial data input signal, the serial data input signal conveying at least one input serial data frame comprising a set of input binary values; receiving the at least one input serial data frame from the serial communication interface at the serial-to-parallel converter circuit block; processing the at least one input serial data frame to read a first subset of input binary values and a second subset of input binary values from the set of input binary values; transmitting the first subset of input binary values via a first output signal and transmitting the second subset of input binary values via a second output signal; selectively propagating to the test data input line of the JTAG interface either a test data input signal received at a respective pin of the electronic device or the first output signal transmitted by the bridge circuit; and selectively propagating to the test mode select line of the JTAG interface either a test mode select signal received at a respective pin of the electronic device or the second output signal transmitted by the bridge circuit.

Without prejudice to the underlying principles, the details and embodiments may vary, even significantly, with respect to what has been described by way of example only, without departing from the extent of protection.

The invention claimed is:

1. An electronic device, comprising:
a processing unit including at least one memory;
a test interface coupled to said processing unit, the test interface comprising a test data input line and a test mode select line, wherein said at least one memory is accessible via said test interface;
a bridge circuit; and
a multiplexer circuit;
wherein said bridge circuit comprises:
a serial communication interface configured to receive a serial data input signal conveying at least one input serial data frame including a set of input binary values, said set of input binary values comprising a first subset of input binary values and a second subset of input binary values, said first subset of input binary values comprising a first half of the input binary values in said set of input binary values, and said second subset of input binary values comprising a second half of the input binary values in said set of input binary values; and
a serial-to-parallel converter circuit configured to:
receive said at least one input serial data frame from said serial communication interface;
process said at least one input serial data frame to read the first subset of input binary values and the second subset of input binary values from said set of input binary values; and
transmit said first subset of input binary values via a first output signal and transmit said second subset of input binary values via a second output signal; and
wherein the multiplexer circuit is configured to selectively propagate either a test data input signal received at a first pin of the electronic device or said first output signal transmitted by said bridge circuit to the test data input line of the test interface, and to selectively propagate either a test mode select signal received at a second pin of the electronic device or said second output signal transmitted by said bridge circuit to the test mode select line of the test interface.

2. The electronic device of claim 1, wherein said set of input binary values comprises eight binary values, and said first subset of input binary values comprises four adjacent binary values in said set of input binary values, and said second subset of input binary values comprises another four adjacent binary values in said set of input binary values.

3. The electronic device of claim 1, wherein said serial communication interface comprises a universal asynchronous receiver-transmitter (UART) interface.

4. An electronic device, comprising:
a processing unit including at least one memory;
a test interface coupled to said processing unit, the test interface comprising a test data input line and a test mode select line, wherein said at least one memory is accessible via said test interface;
a bridge circuit; and
a multiplexer circuit;
wherein said bridge circuit comprises:
a serial communication interface configured to receive a serial data input signal conveying at least one input serial data frame including a set of input binary values; and
a serial-to-parallel converter circuit configured to:
receive said at least one input serial data frame from said serial communication interface;
process said at least one input serial data frame to read a first subset of input binary values and a second subset of input binary values from said set of input binary values; and
transmit said first subset of input binary values via a first output signal and transmit said second subset of input binary values via a second output signal; and
wherein the multiplexer circuit is configured to selectively propagate either a test data input signal received at a first pin of the electronic device or said first output signal transmitted by said bridge circuit to the test data input line of the test interface, and to selectively propagate either a test mode select signal received at a second pin of the electronic device or said second output signal transmitted by said bridge circuit to the test mode select line of the test interface;
wherein said bridge circuit comprises a parallel-to-serial converter circuit configured to:
receive a test data output signal from said test interface;
process said received test data output signal to read a sequence of binary values conveyed by said received test data output signal and arrange said sequence of binary values in at least one output serial data frame; and
transmit said at least one output serial data frame to said serial communication interface;
wherein said serial communication interface is configured to transmit a serial data output signal, the serial data output signal conveying said at least one output serial data frame.

5. The electronic device of claim 4, wherein said serial communication interface is configured to operate in half-duplex mode to receive said serial data input signal and transmit said serial data output signal via a single data line.

6. The electronic device of claim 4, wherein said serial communication interface is configured to operate in full-duplex mode to receive said serial data input signal via a respective input data line and transmit said serial data output signal via a respective output data line.

7. An electronic device, comprising:
a processing unit including at least one memory;
a test interface coupled to said processing unit, the test interface comprising a test data input line and a test mode select line, wherein said at least one memory is accessible via said test interface;
a bridge circuit; and
a multiplexer circuit;
wherein said bridge circuit comprises:
a serial communication interface configured to receive a serial data input signal conveying at least one input serial data frame including a set of input binary values; and
a serial-to-parallel converter circuit configured to:
receive said at least one input serial data frame from said serial communication interface;
process said at least one input serial data frame to read a first subset of input binary values and a second subset of input binary values from said set of input binary values; and
transmit said first subset of input binary values via a first output signal and transmit said second subset of input binary values via a second output signal; and wherein the multiplexer circuit is configured to selectively propagate either a test data input signal received at a first pin of the electronic device or said first output signal transmitted by said bridge circuit to the test data input line of the test interface, and to selectively propagate either a test mode select signal received at a second pin of the electronic device or said second output signal transmitted by said bridge circuit to the test mode select line of the test interface;

wherein said bridge circuit comprises a logic circuit configured to assert an enable signal in response to said serial data input signal conveying an expected enablement sequence of input serial data frames, wherein said serial communication interface is configured to assert a control signal in response to at least one input serial data frame being received, and wherein the serial-to-parallel converter circuit is configured to start processing said at least one input serial data frame in response to said enable signal and said control signal being asserted.

8. A method of accessing a memory of an electronic device, the electronic device comprising a processing unit including at least one memory, a test interface coupled to said processing unit, the test interface comprising a test data input line and a test mode select line, wherein said at least one memory is accessible via said test interface, the electronic device further including a bridge circuit comprising a serial communication interface and a serial-to-parallel converter circuit, the electronic device further including a multiplexer circuit, the method comprising:

receiving a serial data input signal at said serial communication interface, the serial data input signal conveying at least one input serial data frame comprising a set of input binary values, said set of input binary values comprising a first subset of input binary values and a second subset of input binary values, said set of input binary values comprising an even number of input binary values, said first subset of input binary values comprising a first half of the input binary values in said set of input binary values, and said second subset of input binary values comprising a second half of the input binary values in said set of input binary values different from said first half of binary values;

receiving said at least one input serial data frame from said serial communication interface at said serial-to-parallel converter circuit;

processing said at least one input serial data frame to read the first subset of input binary values and the second subset of input binary values from said set of input binary values;

transmitting said first subset of input binary values via a first output signal and transmitting said second subset of input binary values via a second output signal;

selectively propagating either a test data input signal received at a first pin of the electronic device or said first output signal transmitted by said bridge circuit to the test data input line of the test interface; and selectively propagating either a test mode select signal received at a second pin of the electronic device or said second output signal transmitted by said bridge circuit to the test mode select line of the test interface.

9. The method of claim 8, wherein said set of input binary values comprises eight binary values, and said first subset of input binary values comprises four adjacent binary values in said set of input binary values, and said second subset of input binary values comprises another four adjacent binary values in said set of input binary values.

10. An electronic device, comprising:
a processing unit including at least one memory;
a test interface coupled to said processing unit, the test interface comprising a test data input line and a test mode select line, wherein said at least one memory is accessible via said test interface;
a bridge circuit; and
a multiplexer circuit;
wherein said bridge circuit comprises:
a serial communication interface configured to operate in a half-duplex mode to receive a serial data input signal, the serial data input signal conveying at least one input serial data frame including a set of input binary values, wherein said set of input binary values comprises an even number of binary values; and
a parallel-to-serial converter circuit block configured to:
receive a test data output signal from said test interface;
process said received test data output signal to read a sequence of binary values conveyed by said received test data output signal and arrange said sequence of binary values in at least one output serial data frame; and
transmit said at least one output serial data frame to said serial communication interface;
wherein said serial communication interface is configured to transmit a serial data output signal via a single data line, the serial data output signal conveying said at least one output serial data frame; and
wherein the multiplexer circuit is configured to selectively propagate a test data input signal received at a first pin of the electronic device to the test data input line of the test interface, and to selectively propagate a test mode select signal received at a second pin of the electronic device to the test mode select line of the test interface.

11. The electronic device of claim 10, wherein said set of input binary values comprises eight binary values.

12. The electronic device of claim 10, wherein said serial communication interface comprises a universal asynchronous receiver-transmitter (UART) interface.

* * * * *